(12) United States Patent
Tatsumi

(10) Patent No.: US 8,711,533 B2
(45) Date of Patent: Apr. 29, 2014

(54) SEMICONDUCTOR INTEGRATED CIRCUIT

(75) Inventor: Takaaki Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/481,361

(22) Filed: May 25, 2012

(65) Prior Publication Data

US 2012/0307406 A1    Dec. 6, 2012

(30) Foreign Application Priority Data

Jun. 6, 2011    (JP) ................... 2011-126379

(51) Int. Cl.
*H02H 3/22* (2006.01)
(52) U.S. Cl.
USPC .......................................... 361/56; 361/111
(58) Field of Classification Search
USPC .................................... 361/56, 111
See application file for complete search history.

(56) References Cited

U.S. PATENT DOCUMENTS 8,089,739 B2 * 1/2012 Bhattacharya et al. ......... 361/56
8,339,756 B2 * 12/2012 Maloney et al. ................ 361/56

OTHER PUBLICATIONS

Cynthia A. Torres et al.; Modular, Portable, and Easily Simulated ESD Protection Networks for Advanced CMOS Technologies; Electrical Overstress/Electrostatic Discharge Symposium, Sep. 11-13; Symposium Proceedings, p. 81-94.

* cited by examiner

*Primary Examiner* — Danny Nguyen
(74) *Attorney, Agent, or Firm* — Dentons US LLP

(57) ABSTRACT

Disclosed herein is a semiconductor integrated circuit including in a same semiconductor substrate: first and second power supply lines; a protected circuit being connected between the first and second power supply lines and provided with a supply voltage; a detecting circuit detecting a surge generated in the first power supply line; an inverter circuit having one or more inverters connected in series to each other; and a protection transistor being connected between the first and second power supply lines and controlled by output of the detecting circuit to discharge the surge to the second power supply line. In the inverter circuit, an inverter whose output is connected to a control node of the protection transistor is connected between the first power supply line and a third power supply line that is different from the first and second power supply lines.

11 Claims, 4 Drawing Sheets

SEMICONDUCTOR INTEGRATED CIRCUIT

BACKGROUND

The present disclosure relates to a semiconductor integrated circuit in which a protected circuit and a protective circuit that removes a surge generated in a power supply line of the protected circuit are formed in a same semiconductor substrate.

In general, for the semiconductor integrated circuit such as a large scale integrated circuit (LSI), the importance of protecting a circuit having a predetermined function (hereinafter, referred to as internal circuit or protected circuit) from a surge generated in a power supply line of the internal circuit is increasing along with miniaturization and voltage decrease of the semiconductor integrated circuit.

As a representative example of the surge generated in the power supply line, an ESD surge, which suddenly raises the power supply line voltage due to an electrostatic discharge (ESD) to an external terminal of the power supply line, is known.

For the purpose of preventing the internal circuit from being broken down when a high voltage pulse is generated at the external terminal due to the ESD surge, an element or a circuit for ESD protection is integrated in the semiconductor substrate together with the internal circuit (protected circuit).

As the element or the circuit for ESD protection, a gate grounded metal oxide semiconductor (GGMOS), a thyristor, a resister-capacitor MOS (RCMOS), and so forth are known. The respective elements and circuits for ESD protection are accordingly used depending on the use purpose. In recent years, the protective circuit having the RCMOS configuration, which can be designed comparatively easily, is frequently used.

FIG. 1 is a circuit configuration diagram of an ESD protective circuit having the RCMOS configuration. FIG. 1 is a diagram based on a technique disclosed in a non-patent document, C. A. Torres et al; "Modular, Portable, and Easily Simulated ESD Protection Networks for Advanced CMOS Technologies," Electrical Overstress/Electrostatic Discharge Symposium, September 11-13. Symposium Proceedings, P. 81-94, FIG. 1. The circuit configuration and the operations thereof will be described below.

Many internal circuits have a complementary MOS (CMOS) configuration, and an ESD protective circuit 1 having the RCMOS configuration shown in FIG. 1 uses a detecting element including a resistor (R) and a capacitor (C) and a CMOS circuit such as an inverter as a configuration having high process affinity with an internal circuit 6. This ESD protective circuit 1 has a resistive element R, a capacitive element C, a CMOS inverter circuit 4, and a protection transistor 5 connected between a power supply line 2 and a reference voltage line 3 as shown in the diagram.

Specifically, in the ESD protective circuit 1, a MOS transistor (hereinafter, protection transistor) 5 that discharges a high voltage pulse generated in the power supply line 2 attributed to an ESD to the reference voltage line 3 is disposed between the power supply line 2 and the reference voltage line 3. A drain and a source of the protection transistor 5 are connected to the power supply line 2 and the reference voltage line 3, respectively. Furthermore, the resistive element R and the capacitive element C are connected in series between the power supply line 2 and the reference voltage line 3 to configure an RC series circuit. In addition, an inter-element node is connected to an input of the CMOS inverter circuit 4 and an output of the CMOS inverter circuit 4 is connected to a gate of the protection transistor 5.

This ESD protective circuit 1 is so designed as not to react to normal potential rise, fluctuation, and so forth of a power supply line by utilizing a time constant based on the resistive element R and the capacitive element C.

In the case of intentionally raising the potential of the power supply line 2 like the case of normal power activation, the rising speed of the pulse is lower than that at the time of ESD surge generation. Therefore, a potential VRC of the node connecting the resistive element R and the capacitive element C rises up without a long delay from the rise of the potential of the power supply line 2.

In contrast, if a pulse with a frequency higher than that assumed in normal operation (e.g. ESD surge) is applied to the power supply line 2, the potential VRC of the node connecting the resistive element R and the capacitive element C in the RC series circuit rises up with a delay from the potential rise of the power supply line 2. The potential rise in a human body model (HBM), which is a representative model of the ESD, occurs in an extremely-short time of several hundreds of nanoseconds, and the time constant of the RC series circuit is so determined that the above-described potential VRC rises up with a delay from the potential rise of the power supply line 2 responding to the potential rise with such a high frequency.

If the potential VRC rises up with a delay from the rise of the potential of the power supply line 2, a positive pulse generated in the CMOS inverter circuit 4 is applied to the gate of the protection transistor 5 for only the period until the potential VRC reaches the threshold value of the inverter of the CMOS inverter circuit 4.

Thus, the protection transistor 5 is in an on-state for only the time defined by this positive pulse to remove the ESD surge from the power supply line 2 to the reference voltage line 3. Therefore, the internal circuit 6 connected between the power supply line 2 and the reference voltage line 3 is protected from the ESD surge.

When the potential VRC reaches the threshold value of the inverter of the CMOS inverter circuit 4, the positive pulse applied to the gate of the protection transistor 5 ends, and thus this transistor is immediately turned off.

In this manner, the ESD protective circuit having the RCMOS configuration detects the ESD surge by the detecting circuit (RC series circuit) using the resistor (R) and the capacitor (C) and immediately removes the ESD surge from the power supply line in response to the detection result by this detecting circuit.

SUMMARY

The ESD frequently occurs at an external terminal (VDD terminal) 2T connected to the power supply line 2. The ESD occurs also at an external terminal (VSS terminal) 3T connected to the reference voltage line 3, but the reference voltage line 3 is normally extended throughout the semiconductor integrated circuit in order to ground the respective circuits in the semiconductor integrated circuit in common and has high capacitance. Thus, the potential thereof fluctuates less readily. Therefore, the influence given to the circuit operation by noise attributed to the ESD generated in the reference voltage line 3 is not as large as that on the VDD side.

On the other hand, it is not impossible that the ESD occurs after the semiconductor integrated circuit is mounted in electronic apparatus. However, because it is a discharge due to static electricity, the probability that it occurs when an object (human body or mounting apparatus) with static electricity exists in the vicinity is high. Therefore, it is important to ensure ESD protection in manufacturing of the semiconductor integrated circuit and in assembly, i.e. in mounting of the semiconductor integrated circuit on e.g. a circuit board or a package board called an interposer.

In mounting, there exists work in the state in which the reference voltage line 3 is connected to e.g. a ground potential in first and the power supply line 2 is in a floating state. For example, when the semiconductor integrated circuit is bonded to a substrate or the like, there exists work in the case in which the reference voltage line 3 may be regarded as being also in the grounded state via the semiconductor substrate.

If an ESD surge enters the power supply line 2 from the external terminal 2T in the single-side grounded state in which only the reference voltage line 3 is grounded in this manner, possibly the ESD surge causes breakdown of the internal circuit 6.

Because the ESD surge is a high voltage pulse, possibly the ESD protective circuit 1 shown in FIG. 1 is also instantaneously biased by this high voltage. The protection transistor 5 carries out surge discharge by MOS operation in normal operation in which a supply voltage VDD is applied.

On the other hand, the ESD surge voltage serves as the drive bias source also for the CMOS inverter circuit 4.

The inverter includes two transistors, PMOS and NMOS transistors. Normally an almost intermediate level of the bias voltage is equal to the threshold value of inversion operation of the inverter. Therefore, the inverter cannot carry out the inversion operation for the period during which the voltage does not reach this threshold value, and there is an operation delay.

In the case of the inverter circuit for which an ESD surge voltage serves as the drive bias source, the drive bias is applied for only a very short time and therefore the inverter circuit often does not operate.

Furthermore, there is a disadvantage that the power consumption attributed to an off-leakage current is large in normal operation after mounting as described below.

Normally it is desirable that the protection transistor 5 shown in FIG. 1 is formed collectively together with a transistor which is provided in the internal circuit 6 and has the same conductivity type of the channel.

The protection transistor 5 is required to have lower on-resistance for suppression of the clamp voltage. To reduce the on-resistance, the protection transistor 5 cannot help but have gate width and gate length larger than those in the internal circuit 6. In this case, inevitably the off-leakage current becomes larger, which increases the power consumption.

The "clamp voltage" refers to a certain voltage between the source and the drain when the protection transistor 5 is operating and this voltage is applied also to the internal circuit 6. This clamp voltage also needs to be decreased along with a trend for a lower operating voltage of the internal circuit 6. However, currently the decrease in the clamp voltage does not favorably progress because the problem of the above-described power consumption is a bottleneck.

So, it is desired that the off-leakage can be reduced without using parameters relating to the clamp voltage, such as the gate width and the gate length. If this is achieved, it becomes possible to collectively form the protection transistor 5 together with the internal circuit 6. However, such a technique has not yet been proposed.

The present disclosure proposes a semiconductor integrated circuit having a configuration capable of surely carrying out ESD protection in mounting as described above.

Furthermore, from another viewpoint, the present disclosure proposes a semiconductor integrated circuit having a configuration capable of reducing off-leakage by a transistor for leakage removal without affecting the above-described clamp voltage.

According to an embodiment of the technique of the present disclosure, there is provided a semiconductor integrated circuit including in a same semiconductor substrate: first and second power supply lines; a protected circuit being connected between the first and second power supply lines and provided with a supply voltage; a detecting circuit detecting a surge generated in the first power supply line; an inverter circuit having one or more inverters connected in series to each other; and a protection transistor being connected between the first and second power supply lines and controlled by output of the detecting circuit to discharge the surge to the second power supply line. In the inverter circuit, an inverter whose output is connected to a control node of the protection transistor is connected between the first power supply line and a third power supply line that is different from the first and second power supply lines.

In this configuration, even when there is potential variation of the first power supply line, if the speed of the potential variation (e.g. the speed of the potential rise) is not very high, the potential of the inter-element node of the resistive element and the capacitive element changes in such a manner as to substantially track the potential variation of the first power supply line. Thus, the protection transistor is not turned on by the last-stage inverter of the inverter circuit.

On the other hand, if the speed of the potential variation of the first power supply line is high like in surge application, the time until the rise of the potential of the inter-element node of the resistive element and the capacitive element is extended due to a delay determined by the time constant of the resistive element and the capacitive element. At this time, the protection transistor is turned on by the inverter circuit for only a short time until the potential of the inter-element node surpasses the threshold voltage of the inverter of the inverter circuit. When the potential of the inter-element node surpasses the threshold voltage of the inverter, the protection transistor is turned off.

Thus, a somewhat high noise is discharged from the first power supply line to the second power supply line and the protected circuit is not broken down by this high voltage noise.

In the embodiment of the technique of the present disclosure, the inverter circuit includes one or more inverters. In the embodiment of the technique of the present disclosure, if the number of inverters is one, this inverter is connected between the first power supply line and the third power supply line. If plural inverters are included in the inverter circuit, the inverter of the last stage is connected between the first power supply line and the third power supply line. That is, the third power supply line is provided as a dedicated line for the inverter of the last stage separately from the second power supply line used also as a common voltage line of the protected circuit.

For example, in assembly, the first power supply line is in the open state whereas the potential of the second power supply line is fixed in many cases. If a surge is generated in the first power supply line in such a single-side fixed state, potential change appears at the inter-element node of the resistive element and the capacitive element in response to this surge generation.

At this time, if the embodiment of the technique of the present disclosure is not employed, all inverters are biased by the noise voltage applied to the first power supply line on the basis of the potential of the second power supply line, whose potential is fixed. Therefore, a large delay is caused in the inverter circuit and the protection transistor is not turned on in some cases.

In contrast, according to the above-described configuration to which the embodiment of the technique of the present disclosure is applied, the inverter of the last stage is connected between the third power supply line, which is set open in assembly, and the first power supply line. That is, the inverter of the last stage is connected not to the second line, whose potential is fixed or which has high wiring capacitance and thus shows potential variation less readily, but to the third line. Thus, the responsiveness of the inverter of the last stage, which suffers the largest influence of the delay, is enhanced. Accordingly, also in assembly and so forth in which the first power supply line is in the open state, the inverter circuit carries out normal operation and a surge is surely removed from the first power supply line.

There are the following advantages in normal operation as a product after the end of assembly.

A voltage independent of the second power supply line can be set for the third power supply line. Thus, for the third power supply line, a voltage for surely closing the channel to such an extent that the flow of leakage current can be regarded as substantially absent when the protection transistor is in the off-state can be set. For example, if the channel conductivity type of the protection transistor is the N-type, preferably a negative voltage is used as this voltage. At this time, the transistor on the third power supply line side in the inverter of the last stage is turned on and the inverter of the last stage carries out operation of transmitting the applied voltage of this third power supply line (e.g. negative voltage) to the control node of the leakage removal transistor. Thus, the amount of off-leakage current decreases.

The embodiment of the technique of the present disclosure can provide a semiconductor integrated circuit that ensures protection in mounting and can reduce the off-leakage current of the protection transistor without affecting the clamp voltage in normal operation after mounting.

DETAILED DESCRIPTION OF THE PREFERRED EMBODIMENT

Figure 1:
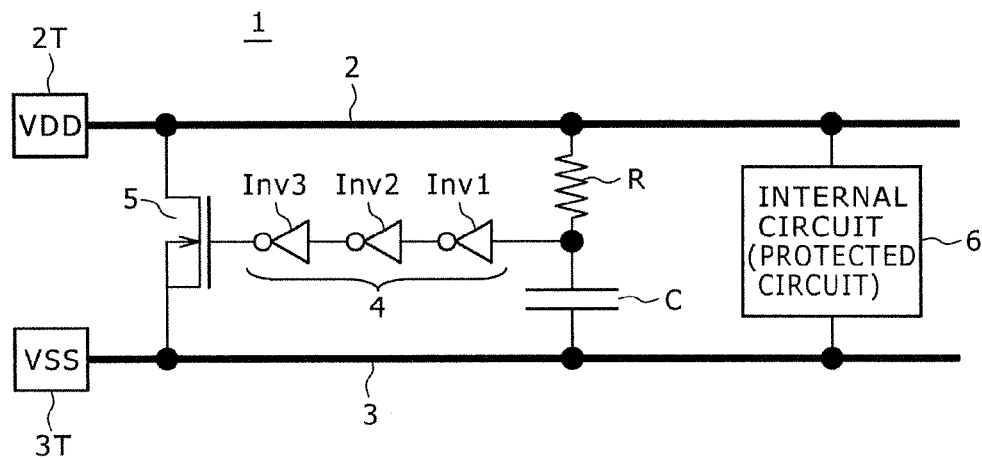
FIG. 1 is a configuration diagram of an ESD protective circuit with an RCMOS configuration that relates to an embodiment and is used for explaining a related art.

A semiconductor integrated circuit having a protective circuit relating to the technique of the present disclosure will be described below with reference to the drawings by taking a semiconductor integrated circuit having an ESD protective circuit as a representative example.

The description will be made in the following order.
1. First Embodiment
[Circuit Configuration of Protective Circuit]
[Operation of Protective Circuit]
[Reduction in Off-leakage]
2. Modification Examples 1. First Embodiment Circuit Configuration of Protective Circuit FIG. 2 shows the circuit configuration of an ESD protective circuit relating to the technique of the present disclosure. FIG. 2 is a diagram obtained by replacing the inverter circuit symbol in FIG. 1 with a specific transistor configuration. Also in FIG. 2, external terminals such as a VDD terminal 2T and a VSS terminal 3T are provided similarly to FIG. 1. However, diagrammatic representation of these external terminals is omitted. Furthermore, an internal circuit (protected circuit) 6 that is connected to a power supply line 2 and a reference voltage line 3 and receives power supply is provided.

These circuit configurations are integrated in the same semiconductor substrate and thereby a semiconductor integrated circuit is formed.

An ESD protective circuit 1 having an RCMOS configuration shown in FIG. 2 has the power supply line 2 as the "first power supply line" connected to the VDD terminal (symbol 2T in FIG. 1) and the reference voltage line 3 connected to e.g. the VSS terminal (symbol 3T in FIG. 1) as one example of the "second power supply line." A supply voltage VDD is applied between the power supply line 2 and the reference voltage line 3.

An internal circuit (protected circuit) 6 that is connected to the power supply line 2 and the reference voltage line 3 and is provided with the supply voltage VDD is disposed.

All circuit elements other than the internal circuit 6 connected to the power supply line 2 and the reference voltage line 3 configure the ESD protective circuit 1 whose protection subject is the internal circuit 6.

In the ESD protective circuit 1, a resistive element R, a capacitive element C, a CMOS inverter circuit 4, and a protection transistor 5 are provided between the power supply line 2 and the reference voltage line 3.

In the present embodiment, the protection transistor 5 is a transistor whose channel conductivity type is the N-type. A drain is connected to the power supply line 2 and a source is connected to the reference voltage line 3. Furthermore, a substrate region of the protection transistor 5 (e.g. P-type well) is electrically short-circuited to the source. This configuration is not essential although it is desirable for stable operation.

The protection transistor 5 has a function to discharge e.g. a positive high voltage pulse (e.g. ESD surge) generated in the power supply line 2 via the VDD terminal 2T attributed to an ESD to the reference voltage line 3.

An RC series circuit (detecting circuit) obtained by connecting the resistive element R and the capacitive element C in series is connected between the power supply line 2 and the reference voltage line 3. In the detecting circuit, the connecting node between the resistive element R and the capacitive element C is connected to an input of the CMOS inverter circuit 4.

In the present embodiment, the resistive element R is connected to the power supply line 2 and the capacitive element C is connected to the reference voltage line 3 because an aim is to remove a positive high voltage pulse generated in the power supply line 2 as described above.

When a positive high voltage pulse (ESD surge) is generated in the power supply line 2, a potential VRC of the connecting node between the resistive element R and the capacitive element C varies. The CMOS inverter circuit 4 is a circuit that controls a control electrode (gate) of the protection transistor 5 based on this variation of the potential VRC between the RC elements.

The CMOS inverter circuit 4 has one or more inverters. In FIG. 2, a three-stage configuration is shown.

Each inverter has a PMOS transistor 4P and an NMOS transistor 4N connected in series between the power supply line 2 and the reference voltage line 3.

A common gate of the PMOS transistor 4P and the NMOS transistor 4N in a first-stage inverter Inv1 is connected to the node between the resistive element R and the capacitive element C. A common drain of the PMOS transistor 4P and the NMOS transistor 4N is connected to an input of a next-stage inverter Inv2.

The next-stage and last-stage inverters Inv2 and Inv3 are also configured almost similarly.

An output of the last-stage inverter Inv3 is connected to the gate (control electrode) of the protection transistor 5.

In the present embodiment, only in the last-stage inverter Inv3, a source of the NMOS transistor 4N is connected to a third power supply line 7 that is different from the reference voltage line 3 (second power supply line).

The third power supply line 7 is a line for supplying a negative voltage (−VS) in the present example and may be connected to an external terminal (−VS terminal) (not shown).

If the internal circuit 6 is a circuit that uses the same negative voltage (−VS), it is preferable for the ESD protective circuit 1 to share the third power supply line 7 with the internal circuit 6.

If the negative voltage (−VS) is generated from e.g. the supply voltage (VDD) in the semiconductor integrated circuit, the external terminal thereof is unnecessary.

[Operation of Protective Circuit]

More detailed operation of the above-described ESD protective circuit 1 will be described below.

The operation of the ESD protective circuit 1 should meet requirements in two situations shown as the following cases (1) and (2) corresponding to the operation explained in the above outline and, in addition, a situation at the time of assembly or substrate mounting shown as the third case (3).

(1) In Normal Operation (Without Surge Application):

This "In Normal Operation (Without Surge Application)" refers to an operation state in which such a large surge as to turn on the protection transistor 5 is not applied to the power supply line although potential variation of the power supply line supposed in normal operation exists. The supposed potential variation of the power supply line means potential variation in power activation and power deactivation and such potential variation that the potential of the power supply line fluctuates with small amplitude attributed to circuit operation.

When the power supply line 2 (first power supply line) is kept at the supply voltage VDD, the capacitive element C in FIG. 2 is in a high impedance state and therefore the potential VRC of the inter-element node substantially takes an H (VDD) level. This H level is applied to the input of the first-stage inverter Inv1 among three inverters, and thus the output thereof takes a L (VSS) level. This output (L level) of the first-stage inverter Inv1 determines the respective outputs of the next and further next inverters Inv2 and Inv3. Thus, the respective potential levels are as follows: H (VRC)→L (Inv1 output)→H (Inv2 output)→L (Inv3 output).

At this time, the gate of the protection transistor 5 is at the L (VSS) level and thus the channel of the protection transistor 5 is closed. Therefore, a current does not flow from the power supply line 2 to which the supply voltage VDD is applied to the reference voltage line 3 to which the reference voltage VSS is applied.

In the technique of the present disclosure, the voltage of the third power supply line 7 can be set independently of the second power supply line (reference voltage line 3) and thus the off-leakage current of the protection transistor 5 is reduced. For example, the negative voltage (−VS) is supplied to the third power supply line 7 like in the present example. In this case, when the last-stage inverter Inv3 operates, the NMOS transistor 4N thereof is turned on to give the negative voltage (−VS) to the gate of the protection transistor 5. The off-leakage current of the protection transistor 5 is greatly smaller when the negative voltage (−VS) is applied to the protection transistor 5 than when the technique of the present disclosure is not applied and the reference voltage VSS (normally 0 V) is applied thereto.

The reduction in the off-leakage current will be described later separately.

On the other hand, when the power supply line 2 is kept at the reference voltage (e.g. GND), a bias voltage is not applied between the source and drain of the protection transistor 5 and thus the protection transistor 5 is not turned on.

At the time of power activation in normal operation, the potential of the power supply line 2 transitions from L to H. However, in the case of such potential rise of the power supply line 2 slower (at a lower speed) compared with a surge, the potential VRC rises up in such a manner as to substantially track the potential rise of the power supply line 2 and therefore the protection transistor 5 is not turned on.

(2) When Surge is Applied:

If an ESD surge is generated at an external terminal (VDD terminal) and enters the power supply line 2, the capacitive element C is turned to a low impedance state for only a very short time. Thus, a discharge current flows to the capacitive element C due to an effect similar to that of high-frequency pulse input to a capacitor. Therefore, a delay determined by the time constant of this capacitive element C and the resistive element R occurs, so that the rise of the potential VRC gets delayed from the potential rise of the power supply line 2. Accordingly, the protection transistor 5 is turned on for only a very short period from the timing when the potential of the power supply line 2 rises up and a bias voltage starts to be applied to the protection transistor 5 to the timing when the potential VRC reaches the threshold voltage of the first-stage inverter Inv1.

More specifically, the input of the last-stage inverter Inv3 becomes the L level. Thus, the channel of the PMOS transistor 4P included in this inverter is opened to become the conductive state and the channel of the NMOS transistor 4N is closed to become the non-conductive state. Therefore, the last-stage inverter Inv3 outputs the H level (VDD level) to the gate of the protection transistor 5.

Thus, the potential of the gate of the protection transistor 5 is turned to the H level for only a short time. Accordingly, the channel thereof is opened and the ESD surge flows from the power supply line 2 to the reference voltage line 3.

This is the operation when the ESD protective circuit functions in normal operation.

(3) When ESD Surge Enters in Assembly Work:

In assembly work, normally only the reference voltage line 3 is connected to the reference potential (e.g. GND) as an electrostatic countermeasure in many cases. On the other hand, no line is connected to the external terminal of the supply voltage VDD (VDD terminal), to which the power supply line 2 is to be coupled. At this time, power is not supplied to the respective inverters and therefore the gate potential of the protection transistor 5 is in an unsettled (e.g. floating) state.

The potential of the third power supply line 7 is also in the floating state. When negative power is given from the external, no line is connected to the external terminal thereof, i.e.

(−VS) terminal. Alternatively, when negative power is internally generated, potential fixing for the third power supply line 7 is not made because power is not supplied to the power supply circuit to generate the negative power.

If an ESD surge suddenly enters the VDD terminal in this state, three inverters and the protection transistor 5 become operable for only a short time by using this ESD surge as substitute for the supply voltage VDD.

Here, a consideration will be made below about a case in which the technique of the present disclosure is not applied, i.e. a case in which the side of the connection to the lower-potential power supply (hereinafter, referred to as the source side), of the last-stage inverter Inv3, is connected to the reference voltage line 3.

At this time, three inverters intend to operate by using the ESD surge applied in a short time as the bias source (power supply). However, because the power supply time is short, it is more difficult for the later-stage inverter, which receives the potential variation later, to perform inversion. Thus, correct operation cannot be carried out as the whole of the CMOS inverter circuit 4 and the protection transistor 5 is not effectively turned on in some cases.

In contrast, in the technique of the present disclosure, the source side of the last-stage inverter Inv3 is connected to the third power supply line 7 in the open state. Thus, the last-stage inverter Inv3 has a lower inverter threshold voltage compared with the other inverters whose source potential is fixed by the reference voltage line 3, and immediately carries out inversion operation even in the case of short power supply by an ESD surge.

In the technique of the present disclosure, in this manner, the source side of the last-stage inverter Inv3, which has a long time from input to the first-stage inverter to inversion operation and suffers the largest influence of delay, is set open in terms of the potential. Thereby, the responsiveness of this last-stage inverter Inv3 is enhanced.

The CMOS inverter circuit 4 is allowed to correctly operate by merely enhancing the responsiveness of the last-stage inverter Inv3, and normal operation of the CMOS inverter circuit 4 is ensured by utilizing this in the technique of the present disclosure. Therefore, even in assembly, the protection transistor 5 is turned on for only a short time and ESD surge removal is enabled.

Figure 3:
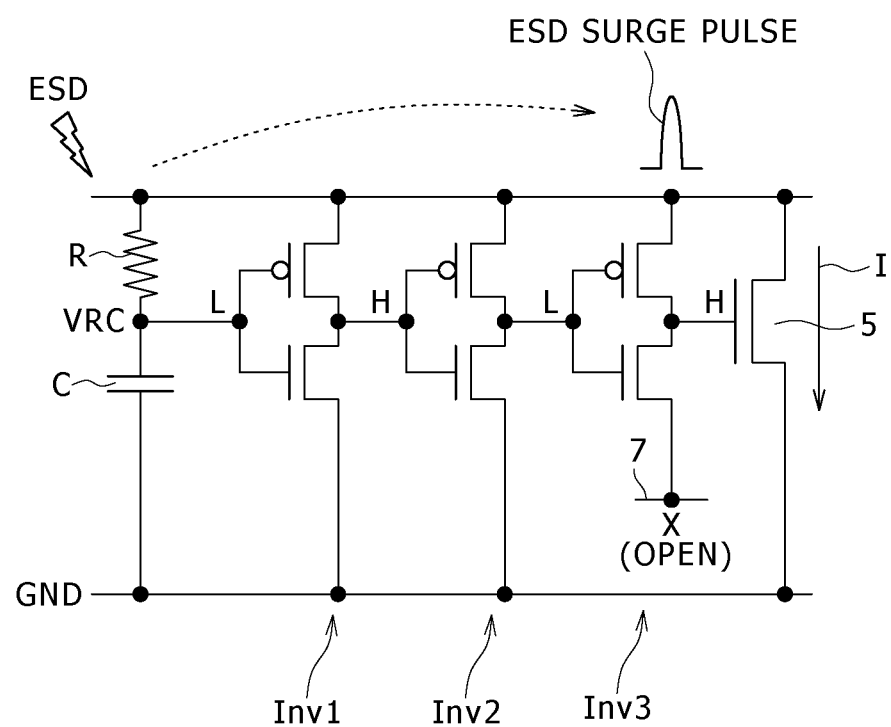
FIG. 3 is an explanatory diagram of the operation of a last-stage inverter.

FIG. 3 is a circuit diagram showing the transition of the potential of input and output of the respective inverters in the CMOS inverter circuit 4.

In order for the respective inverters to correctly operate as described above, inversion transition of the potential level should be made as shown as (L→H→L→H) from the potential VRC of the inter-element node shown in FIG. 3 to the gate potential of the protection transistor 5. However, because these three inverters receive power supply by the same ESD surge pulse, the later-stage inverter carries out the inversion operation less easily.

In the technique of the present disclosure, the source side of the last-stage inverter Inv3, which performs the inversion least easily, is set open in terms of the potential to thereby decrease the threshold voltage of the inversion of this inverter (change the threshold voltage in such a direction as to facilitate the inversion). Thus, the output of the last-stage inverter Inv3 surely becomes H and the protection transistor 5 is turned on for only this H period, so that a removal current I of an ESD surge pulse flows to the protection transistor 5.

FIGS. 4A to 4D show simulation results obtained by investigating the difference in responsiveness between when the potential of the source side of the last-stage inverter Inv3 is fixed and when the source side is set open.

Figure 4A:
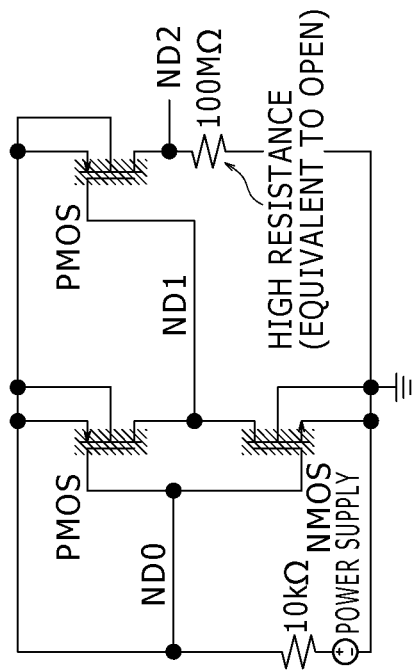
FIGS. 4A to 4D are circuit diagrams in simulation to investigate effects of the technique of the present disclosure and the results of the simulation.
Figure 4B:
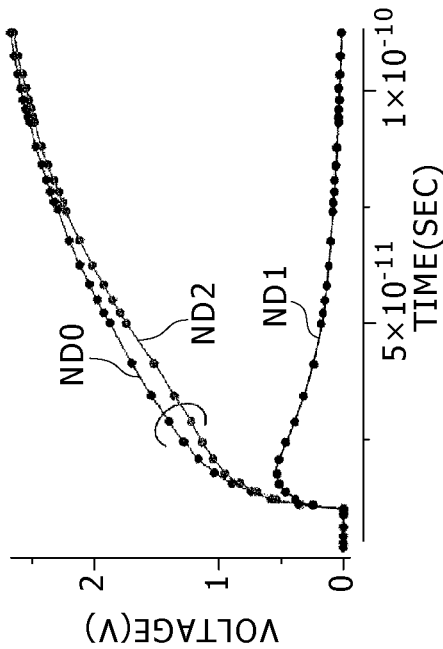
Figure 4C:
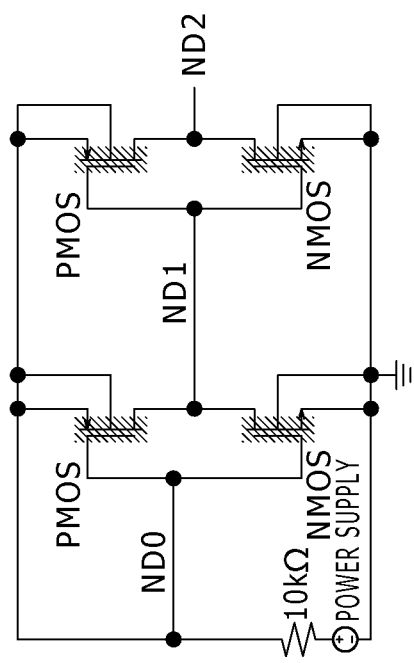
Figure 4D:
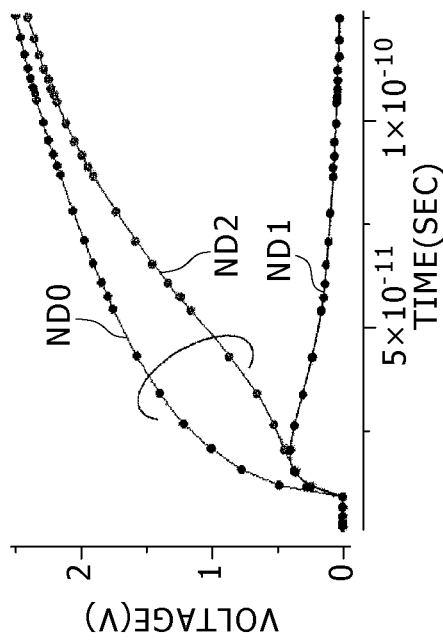

In FIGS. 4A to 4D, FIG. 4A is a circuit diagram in which the source side potential is fixed and FIG. 4B is a plot diagram of potential change obtained by operational simulation about this circuit. Furthermore, FIG. 4C is a circuit diagram in which the source side is set open and FIG. 4D is a plot diagram of potential change obtained by operational simulation about this circuit.

In this circuit simulation, the circuit used is given a two-stage configuration, which is the minimum configuration to allow understanding of the difference in the responsiveness between when the source side is fixed in terms of the potential and when the source side is set open, because the difference in the responsiveness does not depend on the number of stages of the inverters.

In FIG. 4C, the NMOS transistor on the source side of the last-stage inverter is replaced by high resistance (100 MΩ) for stability of the circuit operation. When the source side of the NMOS transistor is set open in terms of the potential, this NMOS transistor has no relation to the operation and therefore it can be replaced by the high resistance (100 MΩ) equivalent to the open state.

In FIG. 4B and FIG. 4D, symbol ND0, symbol ND1, and symbol ND2 represent transition curves about the potential of the input node of the first stage, the potential of the inter-stage node between the first stage and the last stage, and the potential of the output node of the last stage, respectively.

As is apparent from comparison between FIG. 4B and FIG. 4D, it turns out that the tracking (responsiveness) from the rise of the potential of the input node of the first stage (ND0) to the rise of the potential of the output node of the last stage (ND2) is obviously improved by setting the source side of the last-stage inverter open in terms of the potential. This is attributed to that the inversion of the inverter is facilitated by setting the source side of the inverter open.

The technique of the present disclosure makes it possible to surely carry out ESD surge protection operation in assembly by this responsiveness improvement.

[Reduction in Off-Leakage]

Next, a description will be made below about off-leakage reduction in normal operation of the above-described case (1).

In the ESD protective circuit 1 having the RCMOS configuration, in normal operation, the gate of the protection transistor 5 shown in FIG. 2 is in the off-state and the channel is closed when the protection transistor 5 is driven by the reference voltage VSS (e.g. 0 V) as the gate potential.

However, a slight current referred to as off-leakage flows between the source and drain of the protection transistor 5.

In general, the protection transistor 5 has such a size (gate width) as to allow the flow of a large amount of current and therefore this off-leakage current cannot be ignored in terms of the power consumption.

Figure 5:
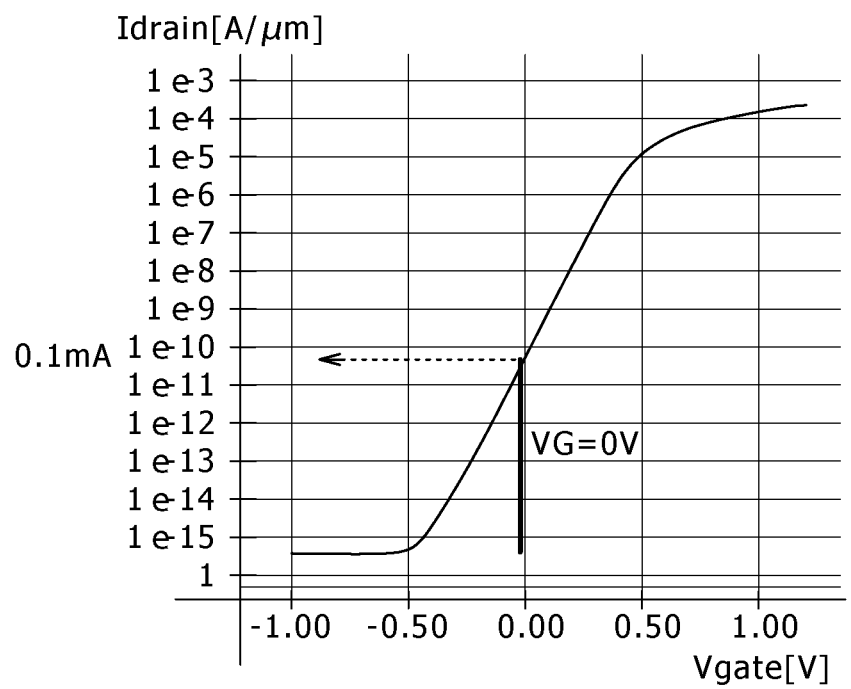
FIG. 5 is a characteristic diagram of gate voltage vs. drain current of an N-type MOS transistor.

FIG. 5 shows a characteristic graph of gate voltage (Vgate) vs. drain current (Idrain) of a typical N-type MOS transistor.

As shown in FIG. 5, when VG is equal to 0 V, a current with the amount shown in the diagram flows. In the present example, an off-leakage current of about less than 0.1 nA is generated per unit gate width (1 μm) according to the graph.

To reduce this off-leakage, in the present embodiment, the source of the NMOS transistor 4N of only the last-stage inverter Inv3 is biased by a negative voltage (−VS) lower than the reference voltage VSS.

In normal operation, the input of the last-stage inverter Inv3 is at the H level. Thus, the channel of the NMOS transistor 4N included in this inverter Inv3 is in the open state and the channel of the PMOS transistor 4P is closed.

If the on-resistance of the NMOS transistor 4N is so low as to be ignorable, the output of the inverter Inv3 is the negative voltage (−VS) itself. Also when the on-resistance of the NMOS transistor 4N is not ignorable, the off-leakage current of the protection transistor 5 can be sufficiently reduced if the negative voltage (−VS) is set sufficiently lower than the reference voltage VSS.

Figure 6:
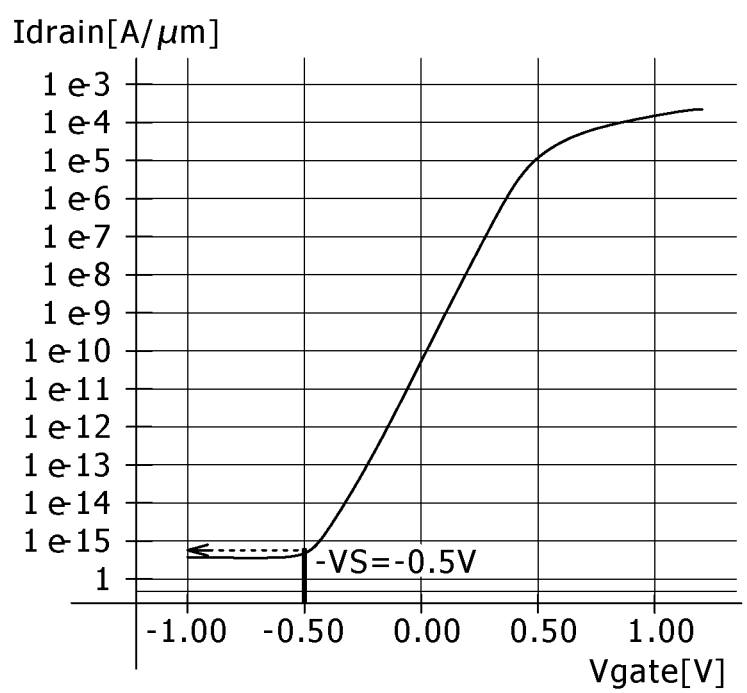
FIG. 6 is the same characteristic diagram as that of FIG. 5 when a negative voltage (−VS) is set to −0.5 V.

FIG. 6 shows the same characteristic graph as that of FIG. 5 except for that the negative voltage (−VS) is set to −0.5 V.

As shown in FIG. 6, even by setting the negative voltage (−VS) lower than the reference voltage VSS (=0 V) by only 0.5 V, the off-leakage current of the protection transistor 5 decreases by about five orders of magnitude. Therefore, it turns out that the application of the negative voltage provides a sufficient effect for off-leakage reduction.

2. Modification Examples

The above circuit configuration is not limited to the above description.

For example, the above description is based on the premise that the ESD surge is a positive pulse voltage. If the ESD surge is negative, an appropriate configuration is obtained by interchanging the positions of the resistive element R and the capacitive element C shown in FIG. 2 and changing the protection transistor 5 from a transistor having an N-type channel to a transistor having a P-type channel.

Figure 2:
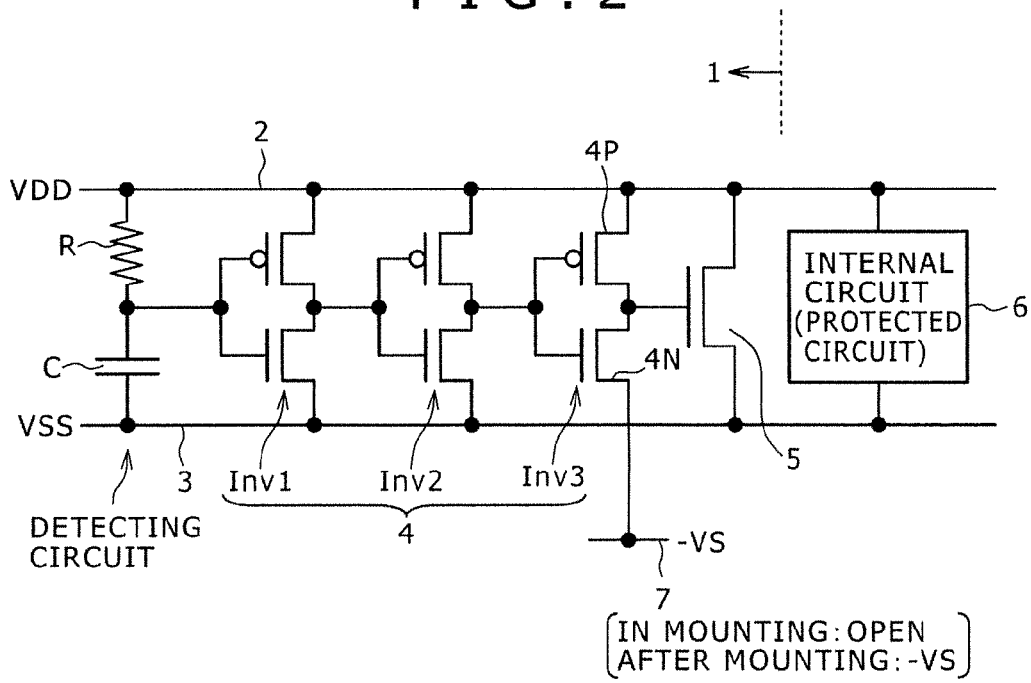
FIG. 2 is a circuit configuration diagram of the ESD protective circuit.

However, removal of an ESD surge of the opposite polarity is possible in the circuit of FIG. 1, which aims at removing a positive ESD surge, or the circuit of the present modification example, which aims at removing a negative ESD surge.

For example, suppose that a negative ESD surge is generated in the power supply line 2 in the circuit of FIG. 1. This negative surge biases, in the forward direction, the diode of PN junction on the higher potential power supply side of the protection transistor 5, i.e. PN junction between the N-type drain impurity region and the P-type substrate region (e.g. P-well region). Thus, the negative ESD surge is immediately discharged from the power supply line 2 to the reference voltage line 3 via this PN-junction diode biased in the forward direction.

Similarly, in the circuit relating to the modification example in which a P-type transistor is employed as the protection transistor 5, a positive ESD surge is immediately discharged from the power supply line 2 to the reference voltage line 3 because the PN-junction diode on the higher potential power supply side connected to the power supply line 2 is biased in the forward direction to be turned on.

In these cases, it is desirable that the number of stages of inverters in the CMOS inverter circuit 4 is set to one or an odd number larger than one.

However, the number of stages of inverters may be set to an even number if removal of a positive surge is mainly performed in the circuit of FIG. 1 and removal of a negative surge is mainly performed in the modification example. In this case, a P-type transistor is employed as the protection transistor 5 in the circuit of FIG. 1 and an N-type transistor is employed as the protection transistor 5 in the modification example.

The resistive element R does not have to be a resistor itself and may be any element as long as it can be regarded as a resistor as impedance. This applies also to the capacitive element C. The capacitive element C does not have to be capacitance itself (capacitor) and may be any element as long as it can be regarded as capacitance as impedance.

In the above description, a negative voltage is employed as the voltage applied to the third power supply line 7. This is because the above description is based on the premise that a positive voltage is applied to the power supply line 2 and the reference voltage line 3 is grounded.

Thus, the kinds of power supply do not necessarily have to be the following three kinds: VDD, VSS, and negative power supply. The power supply having the following three kinds of potentials can be used: relatively higher, middle, and lower potentials. In this case, the difference in the applied voltage between the first power supply line and the third power supply line should be larger than the difference in the applied voltage between the first power supply line and the second power supply line.

Moreover, although description is made above about the effect in mounting and in assembly, the technique of the embodiment provides an advantageous effect also for ESD protection at the time of wafer manufacturing.

In measurement at the time of e.g. pellet check (PC) in a wafer manufacturing step, the substrate back surface or the like is earthed and some kind of ESD protection measure is made. In this case, ESD protection is carried out similarly to the above-described ESD protection in mounting.

According to the above-described present embodiment, ESD protection can be surely carried out in package assembly, in mounting onto a substrate, and in wafer manufacturing.

Furthermore, in normal operation, off-leakage of the protection transistor can be easily reduced without changing element parameters that affect the clamp voltage, such as the gate length and the gate width.

If element parameters such as the gate length and the gate width are changed, redesign of the device is necessary. In contrast, in the present embodiment, addition of the third power supply line is enough and therefore the desired configuration is obtained merely by changing part of the wiring from that in the related art. For example, the above-described remarkable effect can be achieved merely through the following change: the source of the NMOS transistor of the last-stage inverter is disconnected from the VSS (e.g. ground) line and is connected to a newly-provided negative power supply line (third power supply line).

Because great leakage reduction will be achieved through a slight voltage change as shown in FIG. 6, the gate length and gate width of the protection transistor can be equalized or brought close to those of a transistor of the same conductivity type in the internal circuit.

Because the protection transistor should have somewhat high current drive capability, the gate width thereof may be set large. However, the gate length, the channel concentration, other impurity concentrations, and so forth may be set identical to those of the transistor in the internal circuit. Thus, the N-type protection transistor, the N-type transistor of the inverter, and the N-type transistor in the internal circuit can be collectively formed in the P-well of the internal circuit. Moreover, it is also possible to further advance integration of the ESD protective circuit with the internal circuit by employing a thin film resistor and a MIM (metal-insulator-metal) capacitor as the resistive element and the capacitive element, respectively, and burying them in a multilayer wiring layer of the internal circuit.

The present disclosure contains subject matter related to that disclosed in Japanese Priority Patent Application JP 2011-126379 filed in the Japan Patent Office on Jun. 6, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising in one semiconductor substrate:
   first and second power supply lines;
   a protected circuit connected between the first and second power supply lines and provided with a supply voltage;
   a detecting circuit that detects a surge generated in the first power supply line;
   an inverter circuit including one or more inverters connected in series to each other; and
   a protection transistor connected between the first and second power supply lines and controlled by an output of the detecting circuit so as to discharge the surge to the second power supply line,
   wherein,
      in the inverter circuit, an inverter whose output is connected to a control node of the protection transistor is connected between the first power supply line and a third power supply line that is different from the first and second power supply lines.

2. The semiconductor integrated circuit according to claim 1, wherein:
   the inverter circuit includes a plurality of inverters, and
   the inverter of a last stage is connected between the third power supply line and the first power supply line, and the other inverters are connected between the first and second power supply lines.

3. The semiconductor integrated circuit according to claim 1,
   wherein a voltage supplied to the third power supply line is a voltage whose voltage difference from a voltage supplied to the first power supply line is higher than the supply voltage provided between the first and second power supply lines.

4. The semiconductor integrated circuit according to claim 3, wherein:
   a positive voltage is supplied to the first power supply line in which a noise occurs,
   a ground voltage is supplied to the second power supply line, and
   a negative voltage is supplied to the third power supply line.

5. The semiconductor integrated circuit according to claim 4, wherein:
   the number of stages of the inverters is an odd number, and
   a channel conductivity type of the protection transistor is an N-type.

6. The semiconductor integrated circuit according to claim 5, wherein the protection transistor whose channel conductivity type is the same as a channel conductivity type of a transistor of the protected circuit and that transistor of the protected circuit are formed in the same well region in the semiconductor substrate.

7. The semiconductor integrated circuit according to claim 6, wherein:
   the protected circuit is a circuit that uses a negative power supply, and
   the protected circuit shares the third power supply line as a negative power supply line.

8. The semiconductor integrated circuit according to claim 4, wherein:
   the number of stages of the inverters is an even number, and
   a channel conductivity type of the protection transistor is a P-type.

9. The semiconductor integrated circuit according to claim 1, wherein:
   the detecting circuit connects in series a resistive element connected to the first power supply line and a capacitive element connected to the second power supply line, and
   the detecting circuit causes a potential variation at an input of the inverter from a connecting node of the resistive element and the capacitive element in response to occurrence of a positive noise in the first power supply line.

10. The semiconductor integrated circuit according to claim 9, wherein each of the first power supply line, the second power supply line, and the third power supply line is connected to an external terminal to which a different voltage is applied from an external source.

11. The semiconductor integrated circuit according to claim 1, wherein:
    the detecting circuit connects in series a capacitive element connected to the first power supply line and a resistive element connected to the second power supply line, and
    the detecting circuit causes potential variation at an input of the inverter from a connecting node of the capacitive element and the resistive element in response to occurrence of a negative noise in the first power supply line.

* * * * *